(12) United States Patent
Seki

(10) Patent No.: US 6,677,238 B2
(45) Date of Patent: Jan. 13, 2004

(54) SYSTEM AND METHODS FOR FABRICATION OF A THIN FILM PATTERN

(75) Inventor: Shunichi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/425,622

(22) Filed: Apr. 30, 2003

(65) Prior Publication Data

US 2003/0199162 A1 Oct. 23, 2003

Related U.S. Application Data

(62) Division of application No. 09/820,758, filed on Mar. 30, 2001.

(30) Foreign Application Priority Data

Mar. 31, 2000 (JP) .......................................... 2000-099930

(51) Int. Cl.⁷ ...................... H01L 21/49; H01L 21/4763
(52) U.S. Cl. ........................ 438/681; 438/635; 438/680; 438/723
(58) Field of Search ................................ 438/687, 780, 438/681, 722, 737, 975, 976, 723, 778, 761, 255, 240, 680, 635

(56) References Cited

U.S. PATENT DOCUMENTS

| 5,635,105 | A | 6/1997 | Kawata et al. |
| 5,776,254 | A | 7/1998 | Yuuki et al. |
| 5,907,008 | A | 5/1999 | Nakano et al. |
| 5,953,634 | A | 9/1999 | Kajita et al. |
| 6,191,054 | B1 | 2/2001 | Ohtsuka et al. |
| 6,312,526 | B1 | 11/2001 | Yamamuka et al. |
| 6,413,587 | B1 * | 7/2002 | Hawker et al. ............ 427/264 |
| 6,582,767 | B1 * | 6/2003 | Fukushima et al. ......... 427/304 |

FOREIGN PATENT DOCUMENTS

| JP | 8-309918 | 11/1996 |
| JP | 9-74273 | 3/1997 |
| JP | 10-204350 | 8/1998 |
| WO | WO 96/07487 | 3/1996 |

* cited by examiner

*Primary Examiner*—Michael S. Lebentritt
(74) *Attorney, Agent, or Firm*—Oliff & Berridge, PLC

(57) ABSTRACT

The present invention provides a method for fabricating a thin film pattern including forming a pattern made of an organic molecule film on a substrate. The method further includes supplying a solution for forming a thin film onto the organic molecule film pattern, and selectively forming the thin film on the organic molecule film pattern.

8 Claims, 3 Drawing Sheets

SYSTEM AND METHODS FOR FABRICATION OF A THIN FILM PATTERN

This is a divisional of 09/820,758 filed Mar. 30, 2001.

BACKGROUND OF THE INVENTION

1. Field of Invention

The present invention relates to a method for fabricating a pattern of a thin film on a substrate. An example of the thin film is a functional thin film that delivers a predetermined function in various electronic devices, such as a display device and a semiconductor device, more particularly, a metal thin film can be the equivalent to a wiring pattern of the various electronic devices. The invention can also be applied to form a metal thin film pattern for noble metal ornaments other than the electronic devices. The invention also relates to a microstructure equipped with this thin film pattern.

2. Description of Related Art

Traditionally, a wiring board has been fabricated by a method for screen-printing a substrate with a metal paste or by forming a metal film pattern on the substrate by photolithography. As an example of forming a metal thin film on the layer (utilizing the bonding of a thiol group to a gold).

Additionally, as a technique different from the typical metal thin film or metal thin film pattern forming as set forth, Japanese Patent Laid-Open No. 309918/1996 and Japanese Patent Laid-Open No. 74273/1997 disclose a method (proposal 2) that uses the thiol-based coupling agent in order to improve adhesion of a copper foil to a substrate in a copper foil circuit board. Japanese Patent Laid-Open No. 204350/1998 proposes a method (proposal 3) for fabricating a wiring pattern where a gold fine particle covered with a thiol-based molecule is discharged by an ink jet method for patterning.

These proposals have had problems. For example, the proposal 1 has no consideration for forming a metal pattern on the substrate; the proposal 2 requires a manipulation of resist coating to etching in order to form a pattern such as a circuit; and the proposal 3 does not have sufficient adhesion of a metal to the substrate thereunder. That is, the traditionally proposed methods for fabricating the thin film pattern, particularly the metal pattern could not obtain a pattern by a simple method, which provides high adhesion of the substrate side to a thin film and uses no complex resist coating to etching process.

SUMMARY OF THE INVENTION

In order to solve the problems as set forth, this invention provides a patterning method capable of forming a thin film pattern on a substrate with high adhesion. Additionally, a purpose of the invention is to provide a patterning method capable of forming a metal thin film pattern on a substrate with high adhesion.

Furthermnore, a purpose of the present invention is to provide a structure having a thin film pattern provided on a substrate. The thin film pattern has been obtained by patterning as set forth. Besides, a purpose of the invention is to provide a method for forming a thin film pattern on a substrate having excellent adhesion of the substrate to a metal film, for example, by way of no resist coating to etching process.

The invention can include forming a pattern made of an organic molecule film on a substrate, supplying a solution for forming a thin film onto the organic molecule film pattern and selectively forming the thin film on the organic molecule film pattern.

BRIEF DESCRIPTION OF THE DRAWINGS

The invention is described in detail with reference to the following figures, wherein like numerals reference like elements, and wherein.

DETAILED DESCRIPTION OF PREFERRED EMBODIMENTS

Figure 1:
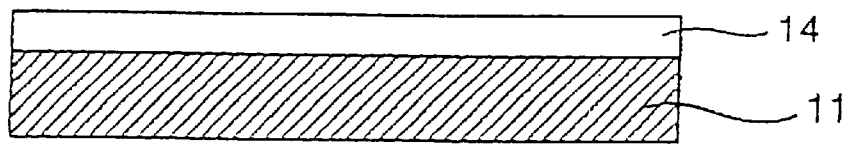
FIG. 1 depicts a cross-sectional view illustrating a state in which a self-assembled film (FAS film) is formed on a substrate.
Figure 2:
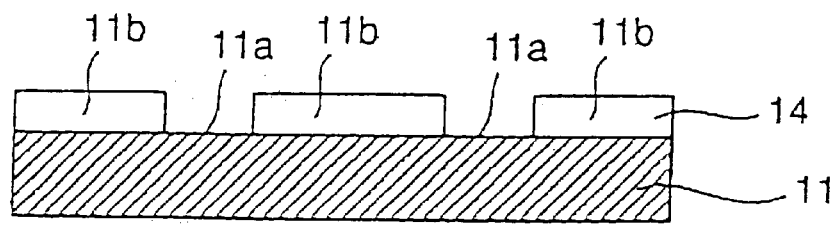
FIG. 2 depicts a cross-sectional view illustrating a state in which the self-assembled film (FAS film) is patterned.

The invention can include forming a pattern made of an organic molecular film on a substrate, supplying a solution for forming a thin film onto the organic molecular film pattern, in order to selectively form the thin film on the organic molecular film pattern.

A first embodiment of the invention is characterized in that a thin film portion of the thin film pattern is a portion of the organic molecule film in the organic molecular film pattern, the thin film portion is formed on an organic molecule film made of a thiol-based coupling agent having a thiol group.

Another embodiment of the invention is characterized in that the organic molecule film pattern is made of a portion including a thiol-based coupling agent having a thiol group and a portion including a coupling agent having a fluoro group, and a thin film is selectively formed on the portion having the thiol-based coupling agent having the thiol group.

Still another embodiment of the invention is characterized in that the thin film is a metal.

Yet another embodiment of the invention is characterized in that a metal thin film is pattern-formed by coating a solution containing an organometallic complex on a substrate formed with the organic molecule film pattern or dipping a substrate formed with the organic molecule film pattern into a solution containing an organometallic complex.

Additionally, another embodiment of the invention is characterized in that a metal thin film is pattern-formed by supplying a composition containing the organic molecule metallic complex onto a substrate formed with the organic molecule film pattern by an ink discharging method.

Furthermore, as another preferred embodiment of the invention, a method for fabricating a metal thin film pattern is provided, which can include the steps of forming an organic molecule film pattern having a fluoro group on a substrate, selectively forming an organic molecule film made of a thiol-based coupling agent on a portion where a film having the fluoro group of the organic molecule film pattern having the fluoro group does not exist, and supplying a solution containing a material for forming a metal thin film onto a pattern including the organic molecule film having the fluoro group and the organic molecule film made of the thiol-based coupling agent to selectively form the metal thin film on the organic molecule film having a thiol group.

Further, as still another preferred embodiment of the invention, a method for fabricating a metal thin film pattern is provided, which can include the steps forming an organic molecule film pattern having a fluoro group on a substrate, and supplying a solution containing an organometallic complex and a thiol-based coupling agent onto the organic molecule film pattern having the fluoro group to selectively form a metal thin film on a portion where a film having the fluoro group of the organic molecule film pattern having the fluoro group does not exist.

Moreover, a method for fabricating an electronic device having steps of forming a metal thin film by the method for fabricating the thin film pattern is provided. As such devices, a semiconductor device, a liquid crystal device and an organic electroluminescent element are preferably named.

Besides, a preferred embodiment is involved in a microstructure, which includes a substrate, an organic molecule film pattern formed on the substrate and a thin film pattern having a pattern based on the organic molecule film pattern. A first embodiment of the microstructure is characterized in that the thin film is made of a metal thin film. Additionally, another embodiment is characterized in that the organic molecule film pattern has a film portion of a thiol-based coupling agent and has a thin film portion of the thin film pattern on the film portion of the thiol-based coupling agent. Still another embodiment is characterized in that the organic molecule film pattern is made of a film portion of a thiol-based coupling agent and a film portion having a fluoro group and has a thin film portion of the thin film pattern on the film portion of the thiol-based coupling agent.

As the substrate used in the invention, publicly known substrates, which are generally used as substrates for use in various electronic devices such as a printed circuit board, can be used widely. For example, a silicon substrate, a silica glass substrate and an indium tin oxide substrate are named.

As the organic molecule film, a compound is used that forms a predetermined organic molecule film pattern on the substrate by a patterning technique such as photolithography. However, a compound is preferable that includes a site (bonding functional group) capable of combining to a base layer (substrate), functional groups such as a thiol, amino, hydroxyl and fluoro group on the other end side and a carbon straight-chain or a carbon chain partially branched which binds these functional groups, where the compound is bonded to the substrate to be self-assembled for forming a molecular film (self-assembled film), a monomolecular film, for example. As such a compound, a silane-coupling agent having various functional groups at the terminal thereof is known.

The self-assembled film is formed by gathering and orientating monomolecules, different from a resin film such as a photoresist material. The self-assembled film can be formed to have an extremely thin film thickness and becomes uniform at an atom level. That is, the same molecules are gathered and located on the film surface so that uniform and excellent liquid repellency or lyophilic can be provided on the film surface, which is useful when micro-patterning is performed in particular. For example, when a fluoroalkylsilane, which is described later, is used as the compound set forth, each compound is oriented to form the self-assembled film so as to position a fluoroalkyl group on the film surface. Thus, uniform and excellent liquid repellency is provided on the film surface.

The silane coupling agent preferably used as the self-assembled film mentioned above generally has a structure of $R_n SiX_{(4-n)}$ (X is a hydrolytic group) where X is one that forms a silanol by hydrolysis to react with a hydroxyl group that can exist on the base layer surface such as a substrate (glass and silicon) and combine with the substrate by siloxane bonding.

Particularly in the invention, two kinds of silane coupling agents can be used preferably. First, a fluoroalkylsilane (FAS) having a fluoro group at the terminal thereof is named. The FAS has a fluoroalkyl group where R is $(CF_3)(CH_2)$-, for example, so that it can reform the base layer surface of the substrate hard to be attached with substances or the surface to be unwet (the surface energy is low). As specific examples of the FAS, compounds such as: (heptadecafluoro-1,1,2,2-tetrahydrodecyl)triethoxysilane, (heptadecafluoro-1,1,2,2-tetrahydrodecyl)trimethoxysilane, and 3-(heptafluoroisopropoxy)propyltriethoxysilane, (heptadecafluoro-1,1,2,2-tetrahydrodecyl)dimethylchlorosilane, (heptadecafluoro-1,1,2,2-tetrahydrodecyl)trichlorosilane and 3-(heptafluoroisopropoxy)propyltrichlorosilane are named.

When using these, each one compound is preferably used separately. However, combinations of two or more of kinds of compounds can be used, as long as the purposes of the invention are intact. Additionally, in the invention, it is preferable to use the FASs as set forth for providing adhesion to the substrate and excellent liquid (ink) repellency as the compounds. Particularly, by pattern-forming the FAS (film), a pattern of a lyophilic (ink) part and a liquid (ink) repellent part having a low surface energy can be obtained.

Secondly, a thiol-based silane coupling agent having a thiol group at a terminal thereof is named, where R is $SH-(-CH_2)$- having a mercapto (thiol group), for example, stably combining to the surface of metals such as a gold, a silver, a copper, an iridium, a gallium and an arsenic, which is nearly a covalent bond. As the thiol-based coupling agent, 3-mercaptopropyltrimethoxysilane and 3-mercaptopropyltriethoxysilane are named.

According to the method of the invention, an organic molecule film such as a self-assembled film using the FAS is preferably formed on the substrate and is patterned on the substrate by utilizing a photoetching technique using a photomask, for example. The silane coupling agent bonded to the substrate can be removed by UV irradiation. A self-assembled film made of the thiol-based silane coupling agent is further formed on a portion where the FAS of the resultant FAS pattern has been selectively removed. That is, a pattern comprising an FAS film portion and a thiol-based silane coupling agent portion (film) is obtained.

Subsequently, a solution containing an organometallic complex is coated on the substrate pattern-formed with the self-assembled film (silane coupling agent layer) having a different functional group at the terminal thereof or the aforesaid substrate is dipped into a liquid containing the organometallic complex and a ligand molecular is removed by heat treatment. Then, a metal film is not attached onto the FAS film portion, and thus the metal film can be formed on the thiol-based silane coupling agent film portion selectively. As a coating method, a method is preferable where a composition containing the organometallic complex is pattern-formed (it is coated on a thiol-based coupling agent layer) by an ink jet method.

Additionally, a composition containing the thiol-based silane coupling agent and the organometallic complex is selectively supplied onto the substrate made of only the FAS film pattern (onto the substrate where the FAS film has been removed) by the ink jet method, for example, and finally the metal thin film can be formed on a portion having no FAS film selectively.

In this case, the metallic complex removes a ligand therefrom by heat, and thus the bonding group (thiol) of the coupling agent does not react with the metal at room temperatures even when coexisting with the (thiol-based) coupling agent. Therefore, when the composition containing the substances set forth is coated by ink jetting, the (thiol-based) coupling agent first reacts with the substrate for bonding. After that, upon separating the ligand from the complex by heat treatment, the complex reacts with the bonding group (thiol group) to selectively form the metal thin film only on the (thiol-based) coupling agent pattern.

Hereafter, one embodiment of the fabrication of the metal thin film pattern according to the method of the invention will be described in more detail with reference to the drawings. This fabricating method can form a metal thin film 13 on the surface of a substrate 11 with a predetermined pattern by way of the sequential steps of FIGS. 1 to 8 (see FIG. 8).

Through FIGS. 1 to 8, a self-assembled film 14 (hereafter, the FAS film is exemplified in the invention) is formed on the surface of the substrate 11 to pattern the FAS film 14. That is, the embodiment can include an FAS film pattern forming process in which an exposed portion 11a where the FAS film is not bonded to the substrate and an area 11b where the surface energy of the FAS film bonded to the substrate is low are formed with a predetermined pattern. Further, a thiol-based coupling agent layer pattern forming process in which the thiol-based coupling agent is attached to the exposed portion 11a to form a pattern of a thiol-based coupling agent layer 12 and a metal thin film forming process in which the metal thin film 13 is laminated on the thiol-based coupling agent layer 12.

FIG. 1 shows the pattern forming process. As shown, the FAS film 14 is formed on the surface of the substrate 11. The FAS film 14 can be formed by containing the compound and the substrate in the same closed container to be allowed to stand at a room temperature for two days or longer. Possible techniques include an ultraviolet ray irradiation, an electron beam irradiation, an X-ray irradiation and a scanning probe microscope (SPM) are named. However, in the invention, the ultraviolet ray (ultraviolet light) irradiation is preferably used. Additionally, the FAS film pattern may be formed by selectively removing the FAS film using an atomic force microscope (AFM) for scanning as a voltage is applied.

Figure 3:
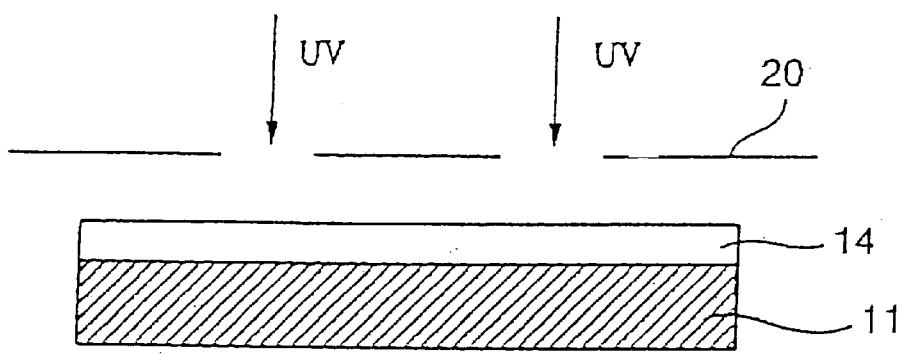
FIG. 3 depicts a cross-sectional view illustrating a state in which the self-assembled film (FAS film) is being patterned by a photolithography method.
Figure 4:
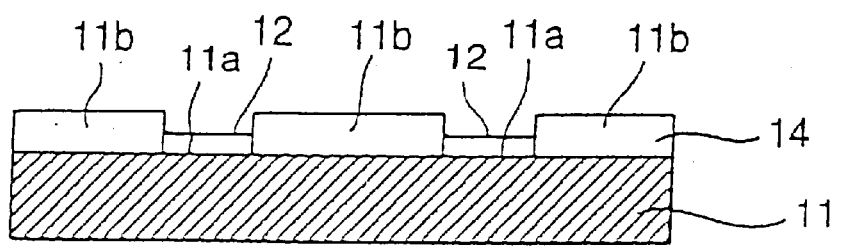
FIG. 4 depicts a cross-sectional view illustrating a state in which a thiol-based coupling agent is bound to areas where the FAS film is not bound to the substrate.

The ultraviolet ray irradiation, as shown in FIG. 3, is performed by irradiating an ultraviolet ray having a predetermined wavelength across the entire surface of the FAS film 14 through a photomask 20 formed with a predetermined pattern. By irradiating the ultraviolet ray on the substrate, compounds forming the FAS film 14 are removed. Thus, in the ultraviolet ray irradiation, the FAS film pattern is formed to have patterns along each of the patterns that have been formed in the photomask.

A wavelength and irradiation time of the ultraviolet ray adopted at this time are arbitrary according to compounds to be used. However, in the case of the FAS, it is preferably used to irradiate an ultraviolet ray having a 172 nm wavelength for a predetermined period of time.

Before applying treatments after FIG. 1, pretreatment such as irradiating the ultraviolet ray on the substrate surface or cleaning with a solvent may be applied.

A metal thin film forming process is performed after the coupling agent layer forming process or both the processes may be incorporated into one process. The former will be referred to as technique 1, while the latter will be referred to as technique 2.

The formation of the thiol-based coupling agent layer (film) can use both a vapor phase method and a liquid phase method. In the case of the vapor phase method, the substrate formed with the FAS film pattern and the thiol-based coupling agent are contained in the same closed container to be allowed to stand at a room temperature for two days or longer and thereby the thiol-based coupling agent layer 12 is selectively formed on the exposed part 11a having no FAS film. Alternatively, in the case of the liquid phase method, the substrate on which the FAS film is patterned is dipped into a solution containing the thiol-based coupling agent, and thereby the thiol-based coupling agent layer 12 is selectively formed. Solvents used for the solution can include solvents, such as a methanol, an ethanol, an isopropyl alcohol, a, toluene, a xylene, an acetone and a tetrahydrofuran. A concentration of the thiol-based coupling agent is a few percent (wt/v); after dipping for several minutes, the substrate is rinsed with the solvent used and further rinsed with water to be dried.

Additionally, the thiol-based coupling agent layer 12 may be selectively formed by pattern-discharging a composition containing the thiol-based coupling agent on the substrate patterned with the FAS film by the ink jet method. Heat is not applied in the ink jet method. Ink jetting by piezo-driving can be preferably used.

A concentration of the thiol-based coupling agent in the ink jet method may be equal to that in the case of the dipping method. However, considering discharge properties and reaction time of the compound to the substrate, a solvent having a low vapor pressure is preferably used as a composition. Similar to the case of the dipping method, after allowing to stand for several minutes, the substrate is rinsed with the solvent used and further rinsed with water to be dried.

Figure 5:
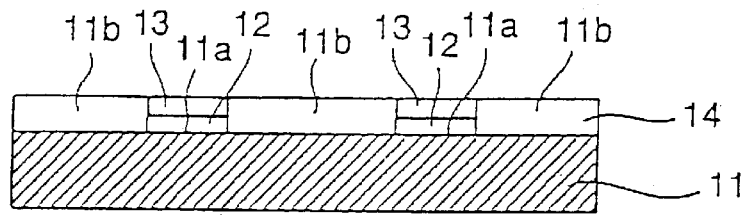
FIG. 5 depicts a cross-sectional view illustrating a process for fixing a metal thin film on a pattern of the thiol-based coupling agent.

Subsequently, the metal thin film forming process is conducted by the ink jet method or the dipping method to form the metal thin film 13 on the coupling agent layer 12 that has been formed, as shown in FIG. 5.

The dipping method can be conducted by dipping the substrate formed with the pattern into a solution containing the metallic compound to be allowed to stand at a temperature for a period of time. The temperature and the time are met to a decomposition temperature of the metallic compound. Additionally, not using heat for decomposing a ligand organic molecule, light irradiation may be conducted for it. Thereby, a metal can be precipitated on a thiol molecule (reducing molecule) selectively.

As the metallic compound, a chloro (trimethylphosphine) gold, a methyl (triphenylphosphine)gold, a colloidal gold, a gold fine particle, a silver nitrate (ammonia solution), a colloidal silver and a silver fine particle can be used.

As the solvent used for the solution, it depends on the metallic compound (organometallic complex) to be used. Additionally, although the concentration is about several percent (wt/v), it can be adjusted depending on the metallic compound to be used.

Additionally, in a similar manner to the case of forming the self-assembled film (silane coupling) by the dipping method, when a gold thin film has been formed, it is preferably rinsed with the solvent used in the solution and/or water.

On the other hand, when the metal thin film is formed by the ink jet method, a piezo driven ink jet head is preferably used because the composition cannot be heated.

Figure 6:
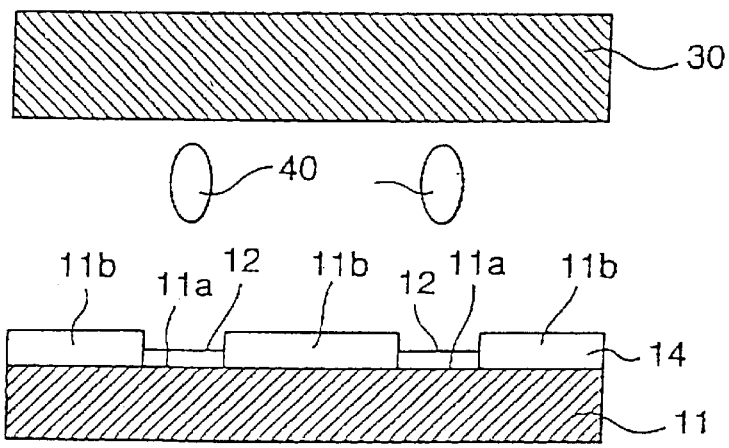
FIG. 6 depicts a cross-sectional view illustrating a state in which an ink composition containing a metallic compound is discharged on the pattern of the thiol-based coupling agent to form a structure of the substrate, the thiol-based coupling agent and a metal thin film.

As shown in FIG. 6, as an ink composition, a metallic compound containing ink composition, which will be described later, is used to discharge a liquid drop 40 of the ink composition onto the thiol-based coupling agent layer 12 from an ink jet head 30 by the ink jet method. At this time, the ink composition is repelled on the FAS film of the areas 11b and is fixed onto only the thiol-based coupling (agent) layer 12. An amount and the number of the ink liquid drop discharged may be adjusted in conformity with a pattern area and a thickness of the metal thin film.

After coating, the substrate is heated to thermally decompose the organic substances of the compound in the liquid drop and thereby a metal can be precipitated on a thiol molecule selectively. Optionally, the heat treatment after coating may be performed under pressure or high hermeticity of solvent molecule partial pressure. A heating temperature depends on a decomposition temperature of a metal-combining product to be used.

As the ink composition used at this time, an ink composition containing an organometallic complex that is decomposed at low temperatures (100° C. or under) is preferably used. The organometallic complex containing ink composition will be described later.

Figure 7:
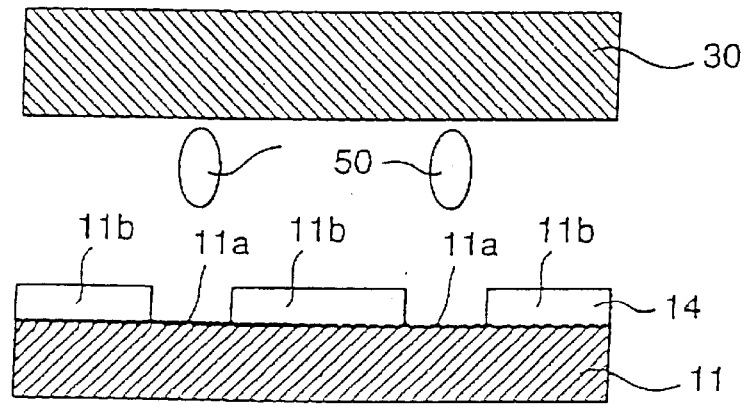
FIG. 7 depicts a cross-sectional view illustrating a state in which an ink composition containing a thiol-based coupling agent and a metallic compound is discharged on areas having no FAS film to form a structure of the substrate, the thiol-based coupling agent and a metal thin film.

Technique 2 can use a thiol-based coupling agent and a metallic compound containing ink composition, which will be described later. As shown in FIG. 7, it can be conducted by discharging a liquid drop 50 of an ink composition onto areas 11a having no FAS film from the ink jet head 30 by the ink jet method. At this time, the ink composition is repelled on the FAS film of the areas 11b and is fixed onto only the areas 11 a having no FAS film selectively. An amount and the number of the ink drop discharged may be adjusted in conformity with a pattern area and a thickness of a metal thin film.

After coating, as similar to the case of the dipping method, after allowing to stand for several minutes, the thiol-based coupling agent is first bonded to the areas 11a and is further thermally decomposed. A metal can be precipitated onto the thiol molecule bonded to the substrate. Optionally, the heat treatment after coating may be performed under pressure or high hermeticity of solvent molecule partial pressure. A heating temperature depends on a decomposition temperature of a metallic compound to be used.

As the ink composition used at this time, an ink composition containing an organometallic complex that is decomposed at low temperatures (100°C. or under) is preferably used. The thiol-based coupling agent and the organometallic complex-containing ink composition will be described later.

Figure 8:
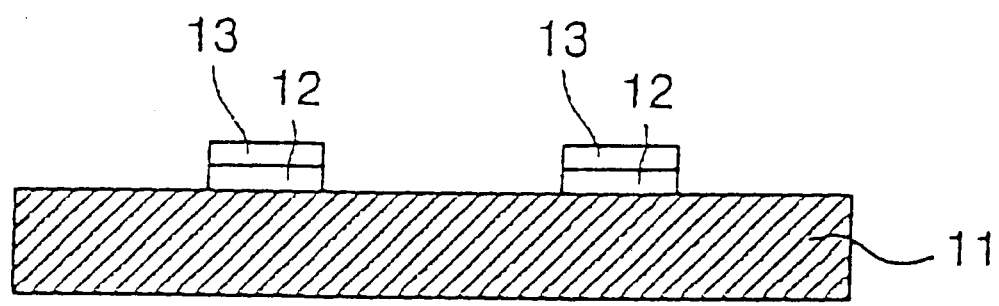
FIG. 8 depicts a cross-sectional view illustrating a state in which the FAS film is removed and a substrate, a pattern of the thiol-based coupling agent and a pattern of a metal are formed on the substrate.

Then, in the fabricating method of the invention, as shown in FIG. 8, after a desired functional film is formed, the remaining self-assembled film (FAS film) is removed as similar to the pattern forming processes as set forth. As further required, typical techniques are used with no limit for forming other films according to purposes, and thus a desired metal thin film containing structure can be obtained.

Next, the ink composition to be used will be described in particular when the ink jet method is adopted in the method of the invention.

As such an ink composition, in the technique 1, a metal containing ink composition that contains an organometallic complex can be used. As the organometallic complex, a methyl(triphenylphosphine)gold can be used.

Additionally, the solvent used for the organometallic complex containing ink composition can include a toluene, a xylene, a mesitylene, a tetralin, a decalin, a tetramethylbenzene, a cyclohexylbenzene, a butylbenzene and a dodecylbenzene. When using the solvents, they can be used separately, or in combination. Considering discharge properties and decomposed temperatures of the organic substances, a solvent having a low vapor pressure (having a boiling point higher than thermal decomposition temperatures of the organometallic complex) is preferably used as a composition. It is preferable to contain at least one or more of solvents having a boiling point of 100° C. or above.

Furthermore, a concentration of the organometallic complex is preferably 0.1 to 10 percent (wt/v) of the entire ink composition. Further, an additive used for a typical ink compositionto may be added.

As the ink composition, for the thiol-based coupling agent and the organometallic complex containing composition which are applied in the technique 2, it is desirable to further add a solvent in which the thiol-based coupling agent is soluble and the thiol-based coupling agent to the organometallic complex containing ink composition. These solvents can include a toluene, a xylene, an acetone, a methylcellosolve and a tetrahydrofuran. An amount of the thiol-based coupling agent is about several percent (wt/v) with respect to the entire ink composition, depending on varieties of the organometallic complexes to be used.

As shown in FIGS. 5 and 8, a metal thin film containing structure 1 so obtained can include the metal thin film 13 formed on the front surface side of the substrate 11 having high adhesion of the metal thin film 13 to the substrate 11. Here, high adhesion can mean that the metal thin film and the substrate are formed through a covalent bond.

In detail, the metal thin film containing structure 1 of the embodiment, as shown in FIG. 8, has the coupling agent layer 12 formed on the substrate 11 with a predetermined pattern and has the metal thin film 13 formed on the coupling agent layer 12.

A thickness of the coupling agent layer 12 is preferably several nanometers. A thickness of the metal thin film 13 is preferably 0.1 to 1.0 $\mu$m.

Additionally, the predetermined pattern is arbitrary in accordance with purposes.

The metal thin film containing structure of the embodiment is useful for various electronic devices such as a printed circuit board and various substrates for computers and noble metal ornaments.

Furthermore, according to the fabricating method of the invention, the metal thin film containing structure excellent in adhesion of the substrate to the metal thin film to be formed can be fabricated easily and simply.

Moreover, it is to be understood that the invention is not limited to the embodiments as set forth, and the present invention can be modified in the range that does not deviate the purposes of the invention.

Hereafter, the invention will be described more specifically in reference to examples, however, it is to be understood that the present invention should not be limited to these.

In a first example, an ultraviolet ray of 172 nm was irradiated on a silicon substrate for 5 to 10 minutes for cleaning as pretreatment. Then, the pattern forming process was conducted as follows.

That is, the silicon substrate and a heptadecafluorotetrahydrooctyltriethoxysilane, one of the FASs, were contained in the same closed container and were allowed to stand at a room temperature for two days. Thereby, the film of the heptadecafluorotetrahydrooctyltriethoxysilane was formed on the surface of the silicon substrate for forming an FAS film. Then, the ultraviolet ray of 172 nm was further irradiated through a photomask having a predetermined pattern thereon to selectively remove only the self-assembled film that is not masked and areas where the silicon substrate was exposed and liquid repellent parts were formed for obtaining an FAS film pattern.

Subsequently, the thiol-based coupling agent layer forming process was conducted as follows. The substrate formed with the pattern was dipped into a solution of 1 wt/v % of 3-mercaptopropyltriethoxysilane in methanol for two minutes.

It was further rinsed with methanol for five minutes and then it was rinsed with pure water for five minutes for forming a thiol-based coupling agent layer made of a monomolecular film of the 3-mercaptopropyltrimethoxysilane on the areas where the silicon substrate surface had been exposed.

Next, the metal thin film forming process was conducted as follows.

The substrate formed with the thiol-based coupling agent layer was close-dipped into a solution of 2 wt/% of methyl (triphenylphosphine)gold in toluene/xylene and was allowed to stand at 80° C. for two hours. Then, it was rinsed with toluene to obtain a metal thin film containing structure where a gold thin film having a 400 nm film thickness was formed on the thiol-based coupling agent layer with a predetermined pattern.

When adhesion of the gold thin film in the resultant metal thin film containing structure was evaluated by a peel test using "Scotch tape" (trade name, Minnesota Mining & Manufacturing Co.), the gold thin film was not peeled off.

In a second example, as with Example 1, the pretreatment, the FAS film pattern forming process and the thiol-based coupling agent layer forming process were conducted. Then, the metal thin film forming process was conducted as follows.

A substrate formed with the thiol-based coupling agent layer was dipped into an aqueous solution of 5 wt% of silver nitrate ammonia to be allowed to stand at a room temperature for five hours. A metal thin film containing structure was obtained where a silver thin film having a 500 nm film thickness was formed on the thiol-based coupling agent layer with a predetermined pattern. When adhesion of the silver thin film in the resultant metal thin film containing structure was measured similar to the Example 1, the silver thin film was not peeled off.

In a third example, as with Example 1, an organometallic complex containing ink composition made of 2 g of methyl (triphenylphosphine)gold, 15 ml of toluene, 35 ml of tetralin and 50 ml of dodecylbenzene was discharged and coated on a substrate formed with the FAS film pattern and the thiol-based coupling agent layer along patterns by the ink jet method and then the substrate was contained in a closed container to be treated at 50° C. for 24 hours or longer. A metal thin film containing structure was obtained on the thiol-based coupling agent layer where a gold thin film having a 200 nm film thickness was formed on the thiol-based coupling agent layer with a predetermined pattern.

As an apparatus, a head of a trade name "MJ930C" was used in the ink jet method.

When adhesion of the gold thin film in the resultant metal thin film containing structure was measured similar to the example 1, the gold thin film was not peeled off.

In a fourth example, as with the Example 1, the pretreatment and the FAS film pattern forming process were conducted on a substrate. Then, the thiol-based coupling agent layer forming process and the metal thin film forming process were conducted as follows.

A thiol-based coupling agent and an organometallic complex containing ink composition, which were made of 1 g of 3-mercaptopropyltrimethoxysilane, 2 g of methyl (triphenylphosphine)gold, 5 ml of tetrahydrofuran, 15 g of xylene, 40 ml of decalin and 40 ml of dodecylbenzene, were discharged and coated on the substrate formed with the FAS film pattern along the FAS film pattern (on the areas having no film portion) by the ink jet method and then the substrate was contained in a closed container to be allowed to stand at a room temperature for five minutes. After that, the substrate was treated at 50° C. for 24 hours or longer. A metal thin film containing structure was obtained where a gold thin film having a 200 nm film thickness was formed with a predetermined pattern.

When adhesion of the gold thin film in the resultant metal thin film, containing structure was measured similar to the Example 1, the gold thin film was not peeled off.

As described above, the invention can provide the pattern fabricating method in which the thin film pattern is obtained on the substrate through the organic molecule film such as the silane coupling agents. The invention can provide the patterning method in which the metal thin film pattern is bonded to the substrate through the thiol-based coupling agents.

According to the method for fabricating the thin film pattern of the invention, the thin film can be bonded to the substrate in a state of high adhesion. The invention can fabricate this pattern using the ink jet method in particular. The invention can provide the structure including the thin film pattern obtained by this pattern fabricating method on the substrate. In this manner, according to the invention, the metal thin film pattern excellent in adhesion of the substrate to the metal thin film can be obtained on the substrate by way of no resist coating to etching process. Furthermore, according to this thin film pattern fabricating method, the fabrication of high-performance electronic devices can be realized as set forth.

What is claimed is:

1. A microstructure, comprising:
   a substrate;
   an organic molecule film pattern formed on said substrate; and
   a thin film pattern having a pattern based on said organic molecule film pattern.

2. The structure according to claim 1, wherein said thin film is made of a metal thin film.

3. The structure according to claim 1, wherein said organic molecule film pattern includes a film portion of a thiol-based coupling agent and a thin film portion of said thin film pattern on the film portion of the thiol-based coupling agent.

4. The structure according to claim 1, wherein said organic molecule film pattern is made of a film portion of a thiol-based coupling agent and a film portion having a fluoro group, and includes a thin film portion of said thin film pattern on the film portion of the thiol-based coupling agent.

5. An electronic device, comprising:

a substrate;

an organic molecule film pattern formed on said substrate; and a thin film pattern having a pattern based on said organic molecule film pattern.

6. The electronic device according to claim 5, wherein said thin film is made of a metal thin film.

7. The electronic device according to claim 5, wherein said organic molecule film pattern includes a film portion of a thiol-based coupling agent and a thin film portion of said thin film pattern on the film portion of the thiol-based coupling agent.

8. The electronic device according to claim 5, wherein said organic molecule film pattern is made of a film portion of a thiol-based coupling agent and a film portion having a fluoro group, and includes a thin film portion of said thin film pattern on the film portion of the thiol-based coupling agent.

* * * * *